(12) United States Patent
Johansson et al.

(10) Patent No.: US 11,461,517 B2
(45) Date of Patent: Oct. 4, 2022

(54) ARRANGEMENT, SYSTEM, METHOD AND COMPUTER PROGRAM FOR SIMULATING A QUANTUM TOFFOLI GATE

(71) Applicants: Niklas Johansson, Linköping (SE); Jan-Åke Larsson, Linköping (SE)

(72) Inventors: Niklas Johansson, Linköping (SE); Jan-Åke Larsson, Linköping (SE)

(*) Notice: Subject to any disclaimer, the term of this patent is extended or adjusted under 35 U.S.C. 154(b) by 521 days.

(21) Appl. No.: 16/607,050

(22) PCT Filed: Apr. 9, 2018

(86) PCT No.: PCT/SE2018/050366
§ 371 (c)(1),
(2) Date: Oct. 21, 2019

(87) PCT Pub. No.: WO2018/194502
PCT Pub. Date: Oct. 25, 2018

(65) Prior Publication Data
US 2020/0193072 A1 Jun. 18, 2020

(30) Foreign Application Priority Data
Apr. 20, 2017 (SE) .................................. 1750467-1

(51) Int. Cl.
*G06F 7/50* (2006.01)
*G06F 30/20* (2020.01)
(Continued)

(52) U.S. Cl.
CPC .............. *G06F 30/20* (2020.01); *G06F 7/722* (2013.01); *G06F 7/727* (2013.01); *G06N 10/00* (2019.01)

(58) Field of Classification Search
USPC ............................ 706/62; 703/13, 14, 15, 16
See application file for complete search history.

(56) References Cited

U.S. PATENT DOCUMENTS

2005/0059020 A1* 3/2005 Vitaliano ............... B82Y 10/00
702/19
2005/0182614 A1 8/2005 Lucius
(Continued)

FOREIGN PATENT DOCUMENTS

CN          106462808 A  *  2/2017  ............. B82Y 10/00
WO    WO-2016200747 A1  * 12/2016  ........... G06F 17/505

OTHER PUBLICATIONS

International Search Report and Written Opinion dated Jul. 11, 2018 for International Application No. PCT/SE2018/050366, 15 pages.
(Continued)

*Primary Examiner* — Brian Ngo
(74) *Attorney, Agent, or Firm* — Knobbe, Martens, Olson & Bear, LLP

(57) ABSTRACT

The present disclosure relates to an arrangement (200) for simulating a quantum Toffoli gate. The arrangement is arranged to receive at least first, second, third, fourth, fifth and sixth classical input bits (a, b, c, d, e, f) and arranged to output at least first, second, third, fourth, fifth and sixth classical output bits. The first, third and fifth classical output bits are arranged to simulate controlled-controlled-NOT, CCNOT, logic based on the first, third and fifth classical input bits (a, c, e). The second, fourth and sixth classical output bits are arranged to simulate phase kickback based on the first, second, third, fourth and sixth classical input bits (a, b, c, d, f). The present disclosure also relates to corresponding systems, methods and computer programs.

12 Claims, 12 Drawing Sheets

(51) Int. Cl.
*G06N 10/00* (2022.01)
*G06F 7/72* (2006.01)

(56) References Cited

U.S. PATENT DOCUMENTS

| | | | | |
|---|---|---|---|---|
| 2006/0224547 | A1* | 10/2006 | Ulyanov | B82Y 10/00 |
| | | | | 706/62 |
| 2018/0144262 | A1* | 5/2018 | Roetteler | B82Y 10/00 |
| 2018/0314969 | A1* | 11/2018 | Thornton | G06N 10/00 |
| 2020/0118026 | A1* | 4/2020 | Ashrafi | H01L 49/006 |

OTHER PUBLICATIONS

Johansson, et al., "Efficient classical simulation of the Deutsch-Jozsa and Simon's algorithms", Institutionen for systemteknik, Linköpings Universitel, Sweden, Nov. 19, 2015, 9 pages.

Michielsen, et al., "A simulator for quantum computer hardware; A simulator for quantum computer hardware", Nanotechnology, IOP, Bristol, GB, vol. 13, No. 1, Dec. 12, 2001, pp. 23-27, right-hand column, paragraph 3.

Bravyi, et al., "Improved classical simulation of quantum circuits dominated by Clifford gates", arxiv.org, Cornell University Library, 201 Olin Library Cornell University Ithaca, NY 14853, Jan. 28, 2016, XP080811566.

Valiant, Association for Computing Machinery: "Quantum computers that can be simulated classically in polynomial time", Proceedings of the 33rd annual ACM Symposium on Theory of Computing Hersonissos, Crete, Greece, Jul. 6-8, 2001, pp. 114-123, XP058310582.

Bremner, et al., "Classical simulation of computing quantum computations implies collapse of the polynomial hierarchy", arxiv.org, Cornell Univeristy Ithaca, NY 14853, May 9, 2010, XP080479501.

* cited by examiner

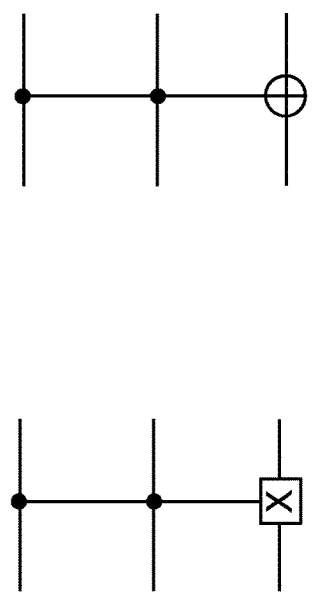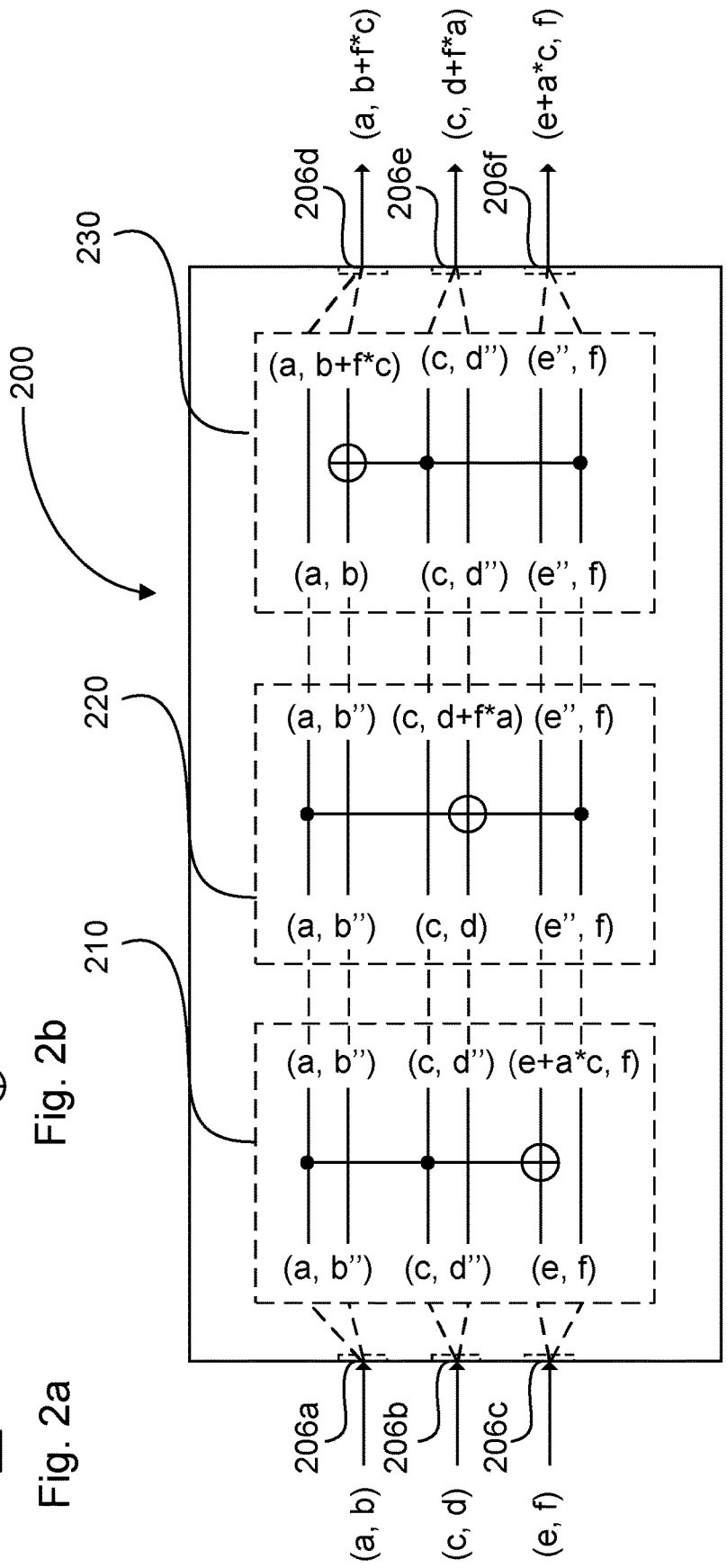

S10
Receiving at least first, second, third, fourth, fifth and sixth classical input bits

S20
outputting at least first, second, third, fourth, fifth and sixth classical output bits, wherein the first, third and fifth classical output bits are arranged to simulate controlled-controlled-NOT, CCNOT, logic based on the first, third and fifth classical input bits, and wherein the second, fourth and sixth classical output bits are arranged to simulate phase kickback based on the first, second, third, fourth and sixth classical input bits

S22
mapping (S22) a first set of classical bits for the simulation of the CCNOT logic

S24
Mapping a second set of classical for the simulation of the phase kickback

Fig. 10

ARRANGEMENT, SYSTEM, METHOD AND COMPUTER PROGRAM FOR SIMULATING A QUANTUM TOFFOLI GATE

CROSS REFERENCE TO RELATED APPLICATIONS

This application is the U.S. National Phase Application under 35 U.S.C. § 371 of International Application No. PCT/SE2018/050366, filed Apr. 9, 2018, which claims priority to Swedish Application No. 1750467-1, filed on Apr. 20, 2017, the entire disclosure of each of which is hereby incorporated by reference.

TECHNICAL FIELD

The present disclosure relates to arrangements, systems, methods and computer programs for simulation of quantum gates by classical means. In particular, the present disclosure relates to arrangements, systems, methods and computer programs for simulating a quantum Toffoli gate.

BACKGROUND

A quantum computer can possibly perform computational tasks more resource efficient than a regular classical computer. The advantage of quantum computers can be assigned to their state space, i.e. the possible states of the quantum bits, and the quantum operations, i.e. the quantum logic gates. A classical computer could be used to simulate the full quantum state space and the operations, but the computational cost would be exponential. Such a simulation would be very inefficient.

There exists a known way to efficiently simulate a smaller set, i.e. a subset, of the quantum states, and a smaller set of gates, on a classical computer. The computational cost of this simulation is polynomial, that is, it grows much slower with the size of the problem. This set is called the set of stabilizer states, and transitions between them are given by a set of transformations called the Clifford group operations. But if a quantum computer is restricted to this smaller set of states, it is no more powerful than a classical computer, so the set is known as an efficiently simulatable gate set.

The set of stabilizer states are the eigenstates, i.e. states that are invariant under, of a smaller group of transformations called the Pauli group, which is a subgroup to the Clifford group. The Pauli group is generated by the Pauli-Z and Pauli-X operations, i.e., the Pauli group of size n is all possible distinct combinations X- and Z-gates on n qubits.

The Clifford gate operations are generated by all possible combinations of three gates: the controlled-not, CNOT, the Hadamard gate, and the Phase gate. These combinations are known as Clifford gates. Even though the set of Clifford gates is smaller than that of all quantum gates, the addition of a quantum gate called Toffoli gate gives a universal gate set for quantum computation. With this gate set one can reach the full power of a quantum computer. Therefore, if one could efficiently and perfectly simulate the Toffoli gate, one could do everything that a quantum computer can do. In other words, a classical computer could then simulate all quantum algorithms with polynomial cost, i.e., efficiently, and the classical computer would be regarded as equally powerful as the quantum computer.

There thus exists a need in the art for efficient simulation of a Toffoli gate using classical computational means.

SUMMARY

An object of the present disclosure is to provide methods and devices configured to execute methods and computer programs which seek to mitigate, alleviate, or eliminate one or more of the above-identified deficiencies in the art and disadvantages singly or in any combination.

The present disclosure aims at providing alternative solutions to implementing quantum gates. In particular, the present disclosure aims at providing classical arrangements, systems, methods and computer programs for simulating a quantum Toffoli gate.

At least some of the objectives are achieved by an arrangement for simulating a quantum Toffoli gate. The arrangement is arranged to receive at least first, second, third, fourth, fifth and sixth classical input bits. The arrangement is further arranged to output at least first, second, third, fourth, fifth and sixth classical output bits. The first, third and fifth classical output bits are arranged to simulate controlled-controlled-NOT, CCNOT, logic based on the first, third and fifth classical input bits. The second, fourth and sixth classical output bits are arranged to simulate phase kickback based on the first, second, third, fourth and sixth classical input bits. Simulating the so-called phase kickback enables an efficient approximation of a quantum Toffoli gate, which thereby enables simulating a strictly larger subset of the quantum states than the stabilizer states in a manner which has the same computational cost scaling as a corresponding quantum system.

According to some aspects, the simulation of the CCNOT logic is achieved by mapping a first set of classical bits comprising the first classical input bit being arranged to be mapped to the first classical output bit, the third classical input bit being arranged to be mapped to the third classical output bit, and the fifth classical input bit with modulo-2 addition of modulo-2 multiplication of the first and third classical input bits being arranged to be mapped to the fifth classical output bit. The simulation of the phase kickback is achieved by mapping a second set of classical bits comprising the second classical input bit with modulo-2 addition of modulo-2 multiplication of the sixth and third classical input bits being arranged to be mapped to the second classical output bit, the fourth classical input bit with modulo-2 addition of modulo-2 multiplication of the sixth and first classical input bits being arranged to be mapped to the fourth classical output bit, and the sixth classical input bit being arranged to be mapped to the sixth classical output bit. The mappings of the classical input bits provide a classical approximation for three quantum bits, qubits, as input. A pair of classical input bits is related to each qubit; one classical input bit for simulating of a binary qubit state and one classical input bit for simulation of quantum phase relating to the qubit. The mappings result in an approximation of phase kickback. This, in addition to providing a phase kickback approximation, also captures symmetry properties of two Toffoli gates in a series. Therein one of the control bits for one of the two Toffoli gates is reversed with respect to its input, i.e. a NOT-operation is performed on the control bit. The mappings enable a plurality of different classical implementations of arrangements for simulating a Toffoli gate. This enables computations that scale like the quantum mechanical systems and algorithms they are part of implementing. Thereby the range of quantum systems that can be effectively simulated using classical computational means is vastly extended.

According to some aspects, the arrangement comprises first, second and third classical control-control-NOT, CCNOT, gates, wherein each classical CCNOT gate is arranged to receive respective first to sixth classical CCNOT input bits and to output respective first to sixth CCNOT output bits. The first classical CCNOT gate is arranged to map its fifth CCNOT classical input bit with modulo-2 addition of modulo-2 multiplication of its first and third classical CCNOT input bits is to its fifth classical CCNOT output bit. The second classical CCNOT gate is arranged to map its fourth classical CCNOT input bit with modulo-2 addition of modulo-2 multiplication of its sixth and first classical CCNOT input bits to its fourth classical CCNOT output bit. The third classical CCNOT gate is arranged to map its second classical CCNOT input bit with modulo-2 addition of modulo-2 multiplication of its sixth and third classical CCNOT input bits to its second classical CCNOT output bit. The three CCNOT gates provide implementations of the arrangement for simulating a quantum Toffoli gate, which are independent on the order of the CCNOT gates. The three CCNOT gates enable embodiments implementing the mappings described above and below.

According to some aspects, the first classical CCNOT gate is arranged to receive the first to sixth classical input bits received by the arrangement for simulating a quantum Toffoli gate, wherein the first classical CCNOT is communicatively connected to the second classical CCNOT gate such that the first to sixth classical CCNOT output bits output by the first CCNOT gate is arranged to be received as respective first to sixth classical CCNOT input bits at the second classical CCNOT gate, wherein the second classical CCNOT gate is communicatively connected to the third classical CCNOT gate such that the first to sixth classical CCNOT output bits output by the second CCNOT gate is arranged to be received as respective first to sixth classical CCNOT input bits at the third classical CCNOT gate, and wherein the third classical CCNOT gate being arranged to output the first to sixth classical output bits of the arrangement for simulating a quantum Toffoli gate. This provides a minimalistic implementation of the arrangement for simulating a quantum Toffoli gate, requiring no extra logical components in addition to the CCNOT gates to achieve both phase kickback and CCNOT logic behavior of the arrangement.

According to some aspects, the arrangement further comprises first, second and third input ports and first, second and third output ports. The first input port is arranged to receive the first and second classical input bits. The second input port is arranged to receive the third and fourth classical input bits, and the third input port is arranged to receive the fifth and sixth classical input bits. The first output port is arranged to output the first and second classical output bits. The second output port is arranged to output the third and fourth classical output bits, and the third output port is arranged to output the fifth and sixth classical output bits. The input and output ports enable an encapsulation of the arrangement which is arranged to take three pairs of classical input bits for simulation of three input qubits, and arranged to output three pairs of classical output bits for simulation of three output qubits Thereby an arrangement is achieved which can work as a separate module that mimics the behavior of a quantum Toffoli gate.

The disclosure also relates to a system for simulating a quantum gate system. The system for simulating a quantum gate system comprises an arrangement for simulating a quantum Toffoli gate as described above and below, and at least one logical element communicatively connected to provide and/or receive at least one classical bit to and/or from the arrangement for simulating a quantum Toffoli gate. The system for simulating a quantum gate system enables implementations for approximating quantum gates that may be used as alternatives for a Toffoli gate in various systems and algorithms. In particular, the disclosed system enables implementation of systems for simulating a quantum Fredkin gate. The disclosed system further enables systems for efficient simulation of quantum systems and/or quantum algorithms comprising a Toffoli and/or a Fredkin gate. The disclosed system enables systems comprising Toffoli gates and combinations of controlled-NOT, CNOT, gates, Hadamard gates, Pauli gates and Phase gates. In other words, the disclosed system enables implementation of classical systems for efficiently simulating universal quantum gates.

According to some aspects, the system is arranged to receive first to sixth classical system input bits and arranged to output first to sixth classical system output bits. The first classical system input bit is arranged to be mapped to the first classical system output bit. The third classical system input bit with modulo-2 addition of modulo-2 multiplication of the first classical system input bit and modulo-2 addition of the third and the fifth classical system input bits is arranged to be mapped to the third classical system output bit. The fifth classical system input bit with modulo-2 addition of modulo-2 multiplication of the first classical system input bit and modulo-2 addition of the fifth and the third classical system input bits is arranged to be mapped to the fifth classical system output bit. Modulo-2 addition of the second classical system input bit with modulo-2 multiplication of first and second sums is arranged to be mapped to the second classical system output bit, the first sum comprising modulo-2 addition of the sixth and the fourth classical system input bits and the second sum comprising modulo-2 addition of the fifth and the third classical system input bits. The fourth classical system input bit with modulo-2 addition of modulo-2 multiplication of the first classical system input bit and modulo-2 addition of the fourth and the sixth classical system input bits is arranged to be mapped to the fourth classical system output bit. The sixth classical system input bit with modulo-2 addition of modulo-2 multiplication of the first classical system input bit and modulo-2 addition of the fourth and the sixth classical system input bits is arranged to be mapped to the sixth classical system output bit. The disclosed set of mappings is one example of arranging the system to be suitable for simulating a quantum Fredkin gate.

According to some aspects, the at least one logical element comprises first and second controlled-NOT, CNOT, arrangements. Each CNOT arrangement is arranged to receive first to fourth CNOT input bits, and arranged to map its first CNOT input bit with modulo-2 addition of its third CNOT input bit to its first CNOT output bit, map its second CNOT input bit to its second CNOT output bit, map its third CNOT input bit to its third CNOT output bit, and map its fourth CNOT input bit with modulo-2 addition of its second CNOT input bit to its fourth CNOT output bit. The first CNOT arrangement is arranged to output its first to fourth CNOT output bits to respective third to sixth input bits of the first to sixth classical input bits of the arrangement for simulating a quantum Toffoli gate. The second CNOT arrangement is arranged to receive the third to sixth classical output bits of the arrangement for simulating a quantum Toffoli gate as its respective first to fourth CNOT input bits. The arrangement for simulating a quantum Toffoli gate, flanked on either side by the disclosed CNOT arrangements provides an implementation of a system for simulating a quantum Fredkin gate.

According to some aspects, the arrangement for simulating a quantum Toffoli gate and/or the at least one logical element is arranged as at least two separate modules, wherein the modules are communicatively connected to each other. By splitting up the system in two or more separate modules, a system that is flexible to rearrange and reconfigure is achieved. The separate modules enable a quick and easy way to remove, replace and/or introduce one or more modules to the system. In this manner, different algorithms and different implementations of the same algorithm can be easily implemented and explored in a flexible manner.

The disclosure also relates to a method for simulating a quantum Toffoli gate. The method comprises receiving at least first, second, third, fourth, fifth and sixth classical input bits. The method further comprises outputting at least first, second, third, fourth, fifth and sixth classical output bits, wherein the first, third and fifth classical output bits are arranged to simulate controlled-controlled-NOT, CCNOT, logic based on the first, third and fifth classical input bits, and wherein the second, fourth and sixth classical output bits are arranged to simulate phase kickback based on the first, second, third, fourth and sixth classical input bits.

According to some aspects, the step of outputting at least the first, second, third, fourth, fifth and sixth classical output bits further comprises the steps of mapping S22 a first set of classical bits for the simulation of the CCNOT logic, wherein mapping S22 the first set of classical bits comprises mapping the first input bit to the first classical output bit, mapping the third classical input bit to the third classical output bit, and mapping the fifth classical input bit with modulo-2 addition of modulo-2 multiplication of the first and third classical input bits to the fifth classical output bit. The method also comprises mapping S24 a second set of classical for the simulation of the phase kickback, wherein mapping S24 the second set of classical bits comprises mapping the second classical input bit with modulo-2 addition of modulo-2 multiplication of the sixth and third classical input bits to the second classical output bit, mapping the fourth classical input bit with modulo-2 addition of modulo-2 multiplication of the sixth and first classical input bits to the fourth classical output bit, and mapping the sixth classical input bit to the sixth classical output bit. The method corresponds to the steps carried out by the arrangement for simulating a quantum Toffoli gate and the method therefore has all the advantages of the arrangement for simulating a quantum Toffoli gate.

The disclosure also relates to a computer program for simulating a quantum Toffoli gate. The computer program comprising instructions which, when the program is executed by a computer, cause the computer to carry out the method as described above and below. The computer program has all the advantages of the method it carries out.

BRIEF DESCRIPTION OF THE DRAWINGS

FIG. 10 illustrates method steps of a method for simulating a quantum Toffoli gate.

DETAILED DESCRIPTION

FIG. 1 illustrates representations of quantum gates for generators of the Clifford group and the X- and Z-gates for generating Pauli-X and Pauli-Z operations of the Pauli group. Also classical approximations for simulating these gates using classical bits are depicted. In particular, FIGS. 1a, c, e, g and i illustrate schematically quantum Pauli-X, Pauli-Z, Hadamard, phase and controlled-NOT gates, respectively. Figs. b, d, f, h and j illustrate systems for simulating quantum Pauli-X, Pauli-Z, Hadamard, phase and controlled-NOT gates by classical means, respectively.

Here, and throughout the present disclosure, figures having a single horizontal line for each input represents quantum systems and figures having pairs of horizontal lines represent classical systems. The pairs of horizontal lines represent input/output channels for pairs of classical bits; one top-line for a computational bit and one bottom-line for a phase bit, as illustrated further above and below. Information, i.e. qubits and classical bits, are assumed to propagate from left to right in all figures, unless stated otherwise.

The set of stabilizer states can be simulated by using two classical bits for each qubit. One classical bit is used for the eigenstates of the Pauli X-gate. This bit may be called the phase-bit. It indicates its relation to the simulation of quantum phase. The other classical bit is used for simulation of the Pauli Z-gate. This bit may be called the computational bit. It indicates its relation to the binary states possible of a quantum bit. State preparation of a computational single qubit state $|k\rangle$ is associated with preparation of a classical bit pair (k,X), wherein k is a computation bit and X is a phase bit. X is typically, but not necessarily, a random evenly distributed classical bit, i.e. either a zero or a one. The normal operation of this simulation is that only half of the 2n bits are known, wherein n is the number of qubits being simulated. The other half is unknown. This is to simulate what is called the uncertainty principle. Measurement in the computational basis is associated with readout of the computational bit followed by randomization of the phase bit. This approximates the uncertainty relation or real measurement disturbance as seen in quantum mechanics. Accordingly, measurement of the phase bit will be followed by a randomization of the computational bit. These constructions of state preparation and measurement prohibits exact preparation and readout of the system; the upper limit is one bit of information per computational- and phase-bit pair (a,b).

Figure 1A:
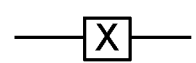
FIG. 1
a, c, e, g and i illustrate schematically quantum Pauli-X, Pauli-Z, Hadamard, phase and controlled-NOT gates, respectively;
b, d, f, h and j illustrate systems for simulating quantum Pauli-X, Pauli-Z, Hadamard, phase and controlled-NOT gates, respectively;
k illustrates preparation and measurement of classical bit pars for representing input and output qubits.

FIGS. 1a, c, e, g and i show the simulation of the two Pauli gates and the three Clifford gates. The Pauli-X gate is arranged to flip the computational-bit. The Pauli-Z gate is arranged to flip the phase-bit. The Hadamard gate is arranged to swap the position of the phase- and computational-bit. The Phase gate is arranged to add the computational-bit to the phase-bit modulo 2 and then flip the computational-bit. The controlled-NOT, CNOT, gate is arranged to flip the computational-bit of the second system if the computational-bit of the first is set, and flip the phase-bit of the first system if the phase-bit of the second system is set. Representing the pair of computational-bit and phase-bit as (a,b): The Pauli-X gate is arranged to perform the mapping (a,b)→(a+1,b), where the addition is modulo 2, i.e. logical exclusive-OR, XOR. The Pauli-Z gate is arranged to perform the mapping (a,b)→(a,b+1). The Hadamard gate is arranged to perform the mapping (a,b)→(b,a). The phase gate is arranged to perform the mapping (a,b)→(a+1,b+a). The CNOT gate acting on the two pairs (a,b)(c,d) is arranged to perform the mapping (a,b)(c,d)→(a,b+d)(c+a,d). The mapping of the CNOT gate is arranged to enable the use of the same identities as those that apply for the quantum CNOT, most importantly the phenomenon often called phase kickback. The term phase kickback comes from the phase shift associated with an auxiliary qubit, or a set of qubits, in a prescribed state $|u\rangle$ and some controlled-U transformation where $U|u\rangle = e^{i\phi}|u\rangle$. Here, U represents the action of a quantum gate and $\phi$ the phase shift of the quantum state $|u\rangle$. Controlled-U means that the form of U depends on the control qubit, i.e. do nothing when the control qubit is in state $|0\rangle$ and apply U when the control qubit is in state $|1\rangle$. Thus, the eigenvalue $e^{i\phi}$ is kicked back in front of the $|1\rangle$ of the first qubit. The phase kickback plays an important role in many quantum computational algorithms and it is a particular advantage of the present disclosure that the disclosed arrangements for simulating a quantum Toffoli gate that the effect of phase kickback is approximated.

Figure 1B:
Figure 1C:
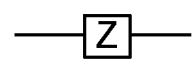
Figure 1D:
Figure 1E:
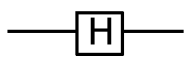
Figure 1F:
Figure 1G:
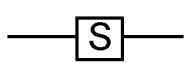
Figure 1H:
Figure 1I:
Figure 1J:
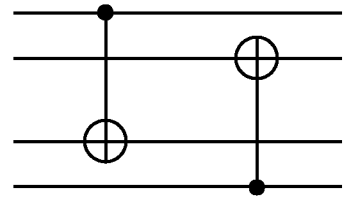
Figure 1K:
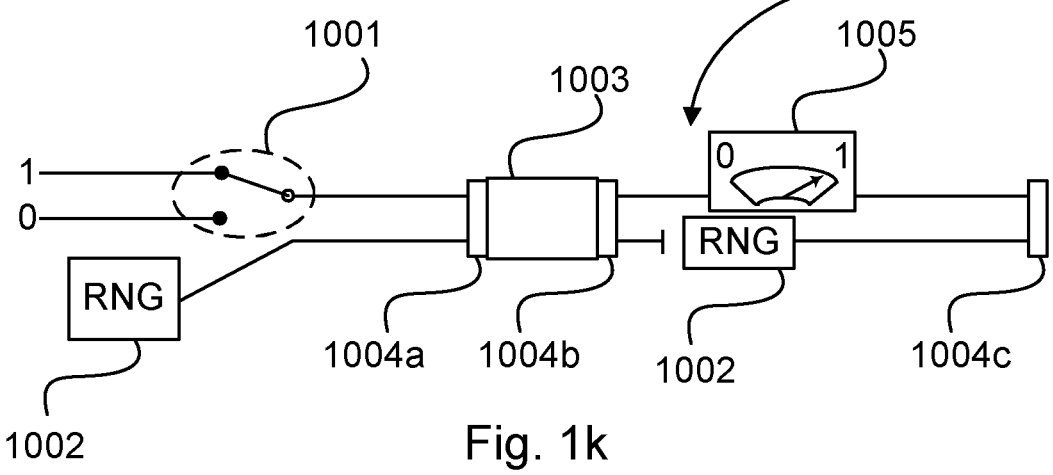

FIG. 1k illustrates preparation and measurement of classical bit pars for representing input and output qubits. The principle of a system 1000 or method for preparing a classical input state for simulating a qubit and measuring a classical output state for simulating a qubit comprises the following. The computational bit is determined via a switch 1001 arranged to select a classical bit value of zero or one. The phase bit is determined by a random number generator, RNG, arranged to output a classical bit value of a zero or a one. The classical bit pair comprising the computational bit and the phase bit is input to a system 1003 comprising at least one arrangement for simulating a quantum gate, e.g. a gate as illustrated in FIGS. 1b, 1d, 1f or 1j, via an input port 1004a. The system 1003 performs a mapping of the input computational and phase bits to respective computational and phase output bits. The computational and phase output bits are output via an output gate 1004b. A measurement apparatus 1005 determines the binary value of the computational output bit, and the phase bit is assigned a random binary value by a random number generator 1002. The measured computational bit and its associated random phase bit is then output, e.g. via an output port 1004c.

FIGS. 2a and b illustrate schematic representations of quantum Toffoli gates, and FIG. 2c illustrates a block diagram of an arrangement 200 for simulating a quantum Toffoli gate. The arrangement 200 for simulating a quantum Toffoli gate is arranged to receive at least first, second, third, fourth, fifth and sixth classical input bits (a, b, c, d, e, f) and arranged to output at least first, second, third, fourth, fifth and sixth classical output bits. The first, third and fifth classical output bits are arranged to simulate controlled-controlled-NOT, CCNOT, logic based on the first, third and fifth classical input bits. The second, fourth and sixth classical output bits are arranged to simulate phase kickback based on the first, second, third, fourth and sixth classical input bits. The first, third and fifth classical input bits (a, c, e) thus correspond to computational bits as described above, and the second, fourth and sixth classical input bits (b, d, f) correspond to phase bits as described above. In other words, bit pairs of a bit chosen from the first, third and fifth classical input bits (a, c, e) and a bit chosen from and the second, fourth and sixth classical input bits (b, d, f) may be arranged to represent a qubit input state. For instance, the pairs (a,b) and (c,d) may represent first and second control qubits for a NOT operation of a qubit represented by the pair of classical input bits (e, f).

A technical effect is that one can simulate a larger subset of the quantum states than the stabilizer states and a larger set of gates than the Clifford group operations, on a regular classical computer. It does so by using computational resources, i.e. time and memory, that scales polynomially with the problem size, i.e. number of simulated qubits.

Another technical effect is that the arrangement exhibits the phase feedback in the form of phase kickback exhibited by a quantum Toffoli gate.

The disclosed arrangement enables classical implementation of the Deutsch-Jozsa algorithm, Simon's algorithm, quantum teleportation and quantum cryptography that uses computational resources scales polynomially with the problem size. It is also possible to implement certain instances of Shor's algorithm, e.g. factoring the number fifteen into numbers three and five, using the same amount of resources as the corresponding quantum algorithm.

According to some aspects, the simulation of the CCNOT logic is achieved by mapping a first set of classical bits comprising the first classical input bit being arranged to be mapped to the first classical output bit, the third classical input bit being arranged to be mapped to the third classical output bit, and the fifth classical input bit with modulo-2 addition of modulo-2 multiplication of the first and third classical input bits being arranged to be mapped to the fifth classical output bit. The simulated phase kickback is achieved by a second set of classical bits comprising the second classical input bit with modulo-2 addition of modulo-2 multiplication of the sixth and third classical input bits being arranged to be mapped to the second classical output bit, the fourth classical input bit with modulo-2 addition of modulo-2 multiplication of the sixth and first classical input bits being arranged to be mapped to the fourth classical output bit, and the sixth classical input bit being arranged to be mapped to the sixth classical output bit. In other words, denoting the first to sixth classical input bits as a, b, c, d, e, f, the simulation of the Toffoli gate acts on three pairs of bits as (a,b)(c,d)(e,f)→(a,b+f*c)(c,d+f*a)(e+a*c,f), wherein the addition is modulo 2, i.e. logical exclusive-OR, XOR, and wherein * is modulo-2 multiplication, i.e. logical AND.

According to some aspects, the arrangement 200 comprises first, second and third classical control-control-NOT, CCNOT, gates 210, 220, 230, wherein each classical CCNOT gate 210, 220, 230 is arranged to receive respective first to sixth classical CCNOT input bits and to output respective first to sixth CCNOT output bits. The first classical CCNOT gate 210 is arranged to map its fifth CCNOT classical input bit with modulo-2 addition of modulo-2 multiplication of its first and third classical CCNOT input bits is to its fifth classical CCNOT output bit. The second classical CCNOT gate 220 is arranged to map its fourth classical CCNOT input bit with modulo-2 addition of modulo-2 multiplication of its sixth and first classical CCNOT input bits to its fourth classical CCNOT output bit. The third classical CCNOT gate 230 is arranged to map its second classical CCNOT input bit with modulo-2 addition of modulo-2 multiplication of its sixth and third classical CCNOT input bits to its second classical CCNOT output bit. A quantum Toffoli gate is approximately simulatable by using the arrangement 200 comprising of three classical Toffoli gates 210, 220, 230 in an intricate pattern between the three pairs of classical bits used in the simulation.

According to some aspects, the first classical CCNOT gate 210 is arranged to receive the first to sixth classical input bits a, b, c, d, e, f received by the arrangement 200 for simulating a quantum Toffoli gate, wherein the first classical CCNOT gate 210 is communicatively connected to the second classical CCNOT gate 220 such that the first to sixth classical CCNOT output bits output by the first CCNOT gate 210 is arranged to be received as respective first to sixth classical CCNOT input bits at the second classical CCNOT gate 220. The second classical CCNOT gate 220 is communicatively connected to the third classical CCNOT gate 230 such that the first to sixth classical CCNOT output bits output by the second CCNOT gate 220 is arranged to be received as respective first to sixth classical CCNOT input bits at the third classical CCNOT gate 230. The third classical CCNOT gate 230 is arranged to output the first to sixth classical output bits of the arrangement 200 for simulating a quantum Toffoli gate. This arrangement provides a minimalistic implementation of an arrangement 200 for simulating a quantum Toffoli gate, requiring no additional logic for the simulation.

Figure 2D:
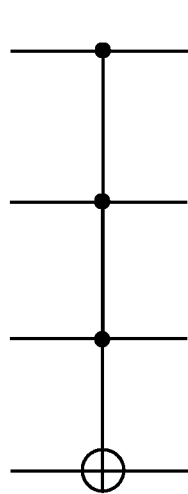
FIG. 2
a and b illustrate schematic representations of quantum Toffoli gates;
c illustrates a block diagram of an arrangement for simulating a quantum Toffoli gate;
d and e illustrate extensions of quantum Toffoli gates.
Figure 2E:
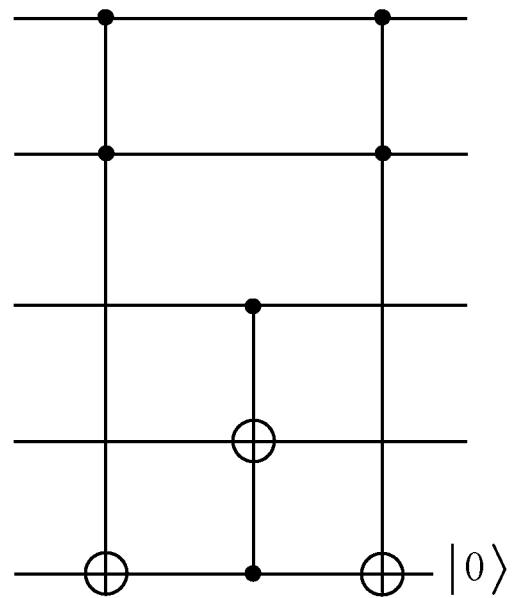
Figure 3A:
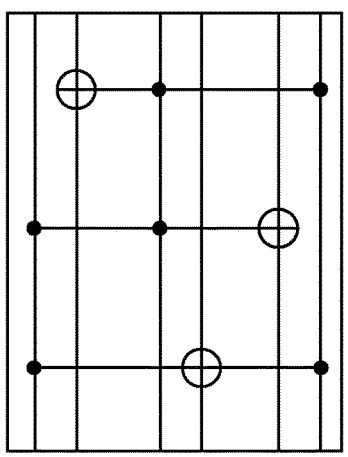
FIG. 3
a-f illustrate arrangements for simulating a quantum Toffoli gate.
Figure 3B:
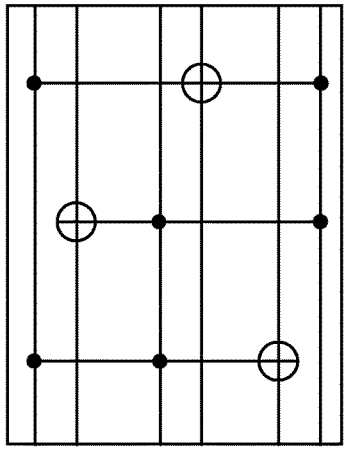
Figure 3C:
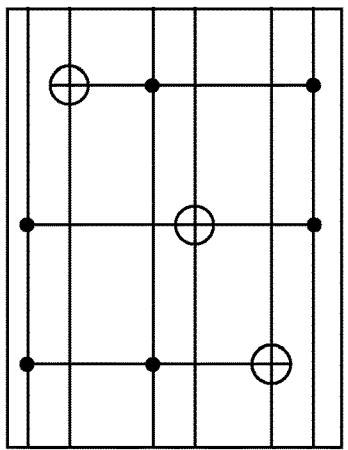
Figure 3D:
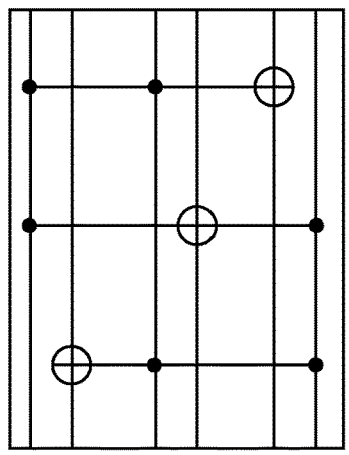
Figure 3E:
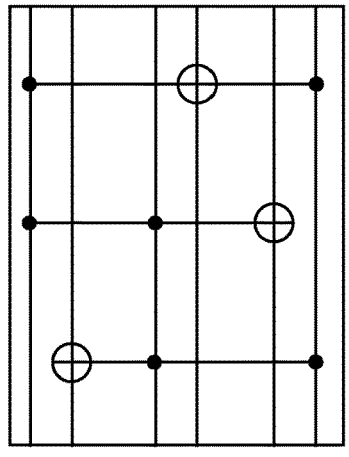
Figure 3F:
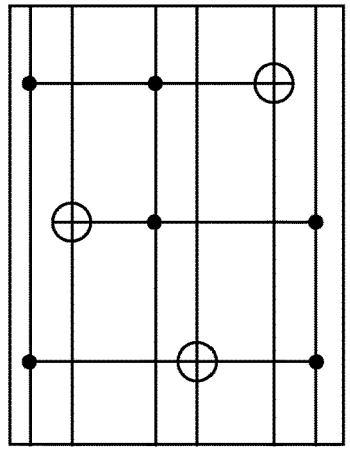

It may be desirable to implement the arrangement 200 as a separate module capable of communicating with other logical modules. Thus, according to some aspects, the arrangement 200 further comprises first, second and third input ports 206a, 206b, 206c and first, second and third output ports 206d, 206e, 206f. The first input port 206a is arranged to receive the first and second classical input bits. The second input port 206b is arranged to receive the third and fourth classical input bits. The third input port 206c is arranged to receive the fifth and sixth classical input bits. The first output port 206d is arranged to output the first and second classical output bits. The second output port 206e is arranged to output the third and fourth classical output bits. The third output port 206f is arranged to output the fifth and sixth classical output bits. The input and output ports enables encapsulation of the arrangement 200 and provides an effective means for a quick and easy way to remove, replace and/or introduce one or more modules to a system for simulating quantum gates, e.g. a gate array. Toffoli gates can also be extended to be arranged to receive more than two control bits. FIGS. 2d and 2e illustrate extensions of quantum Toffoli gates. FIG. 2d illustrates a quantum Toffoli gate for receiving three control bits. The quantum Toffoli gate of FIG. 2d can be realized by the quantum gate system illustrated in FIG. 2e. FIG. 2e comprises three quantum Toffoli gates, with an input qubit being in a predetermined zero-state, also known as an ancilla bit. Such a system can be simulated in a straightforward manner using arrangements for simulating a quantum Toffoli gate as disclosed herein.

FIGS. 3a-f illustrate arrangements for simulating a quantum Toffoli gate. Each arrangement comprises first, second and third classical control-control-NOT, CCNOT, gates wherein each classical CCNOT gate is arranged to receive respective first to sixth classical CCNOT input bits and to output respective first to sixth CCNOT output bits. The first classical CCNOT gate is arranged to map its fifth CCNOT classical input bit with modulo-2 addition of modulo-2 multiplication of its first and third classical CCNOT input bits is to its fifth classical CCNOT output bit. The second classical CCNOT gate is arranged to map its fourth classical CCNOT input bit with modulo-2 addition of modulo-2 multiplication of its sixth and first classical CCNOT input bits to its fourth classical CCNOT output bit. The third classical CCNOT gate is arranged to map its second classical CCNOT input bit with modulo-2 addition of modulo-2 multiplication of its sixth and third classical CCNOT input bits to its second classical CCNOT output bit. The illustrated arrangements illustrate that the order of the three CCNOT gates is arbitrary; the resulting mapping is still (a,b)(c,d)(e, f)→(a,b+f*c)(c,d+f*a)(e+a*c,f), wherein the addition is modulo 2, i.e. logical exclusive-OR, XOR, and wherein * is modulo-2 multiplication, i.e. logical AND. In addition to only permutations of the three CCNOT gates, it is possible to achieve the mapping by including logical elements wherein the effects of its logical operations cancel each other out. In other words, there are an infinite number of implementations that results in the disclosed mapping (a,b)(c,d) (e,f)→(a,b+f*c)(c,d+f*a)(e+a*c,f).

FIG. 4 aims at illustrating the motivation for why the three CCNOT gates of the arrangement for simulating a quantum Toffoli gate are arranged the way they are, thereby further facilitating understanding of the disclosed arrangements. FIGS. 4a-f illustrate schematic representations of quantum systems comprising two Toffoli gates, and FIG. 4g illustrates an arrangement for simulating a quantum Toffoli gate. FIGS. 4a-b illustrate the same quantum gate system, which is effectively reduced to the quantum gate illustrates FIG. 4c. Likewise, FIGS. 4d-e illustrate the same quantum gate system, which is effectively reduced to the quantum gate illustrates FIG. 4f. The difference between the two Toffoli gates in either quantum gate system differs in that one of the control qubits is flipped with respect to its input qubit. There exists a symmetry between the quantum gate systems of FIGS. 4a-c and FIGS. 4d-f, wherein the choice of which control qubit is quite arbitrary. However, the effect of phase kickback will depend on which control qubit is flipped. An arrangement for simulating a quantum Toffoli gate should preferably reflect this aspect.

Figure 4C:
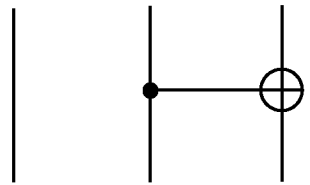
FIG. 4
a-f illustrate schematic representations of quantum systems comprising two Toffoli gates;
g-h illustrate arrangements for simulating a pair of quantum Toffoli gates;
i illustrates an arrangement for simulating a quantum Toffoli gate.
Figure 4F:
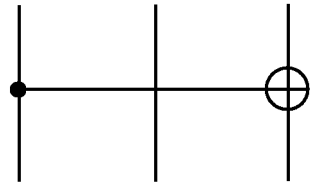
Figure 4B:
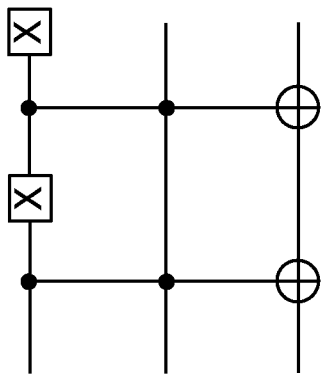
Figure 4E:
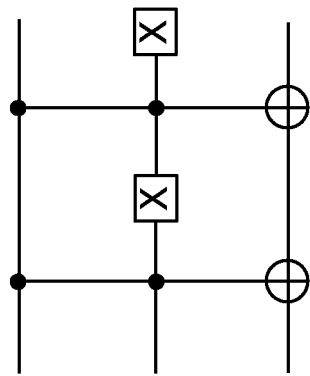
Figure 4A:
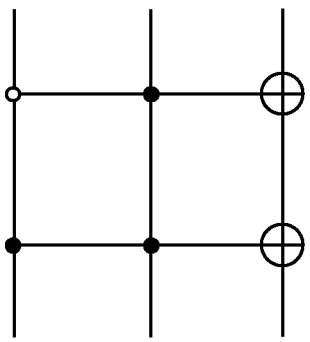
Figure 4D:
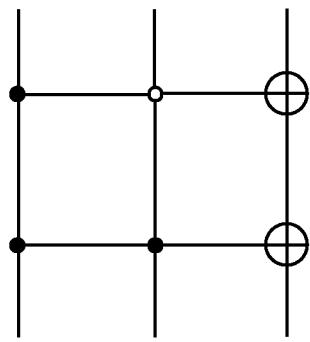
Figure 4I:
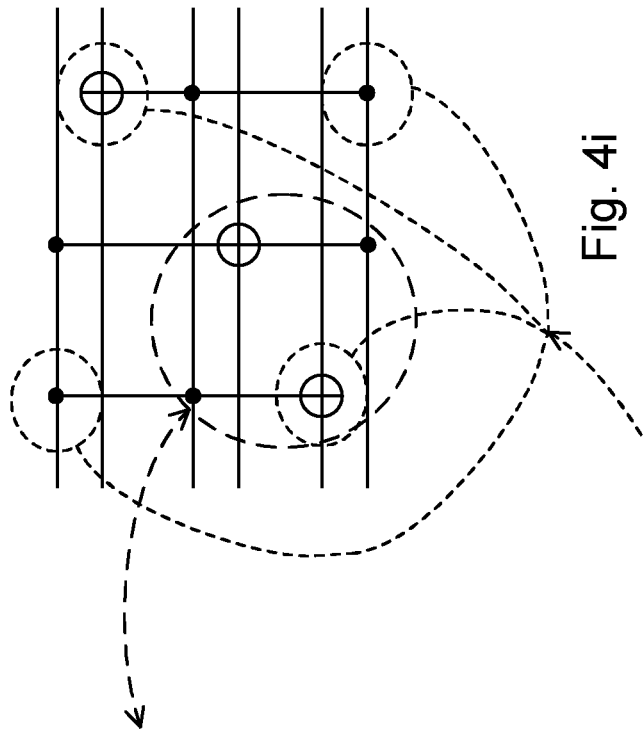
Figure 4G:
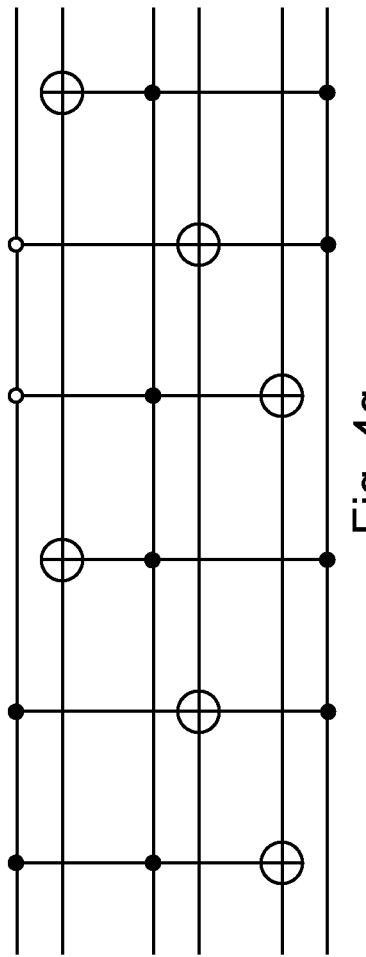
Figure 4H:
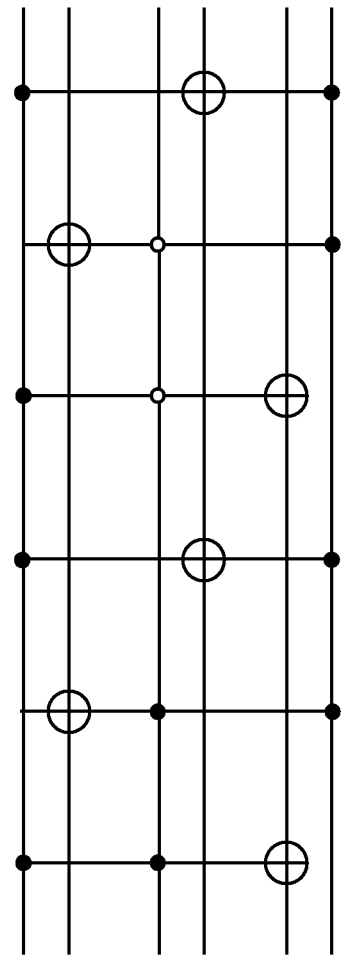

Using the disclosed arrangement for simulating a quantum Toffoli gate, the pairs of quantum Toffoli gates illustrated in FIGS. 4a-c and FIGS. 4d-f can be simulated classically. FIGS. 4g and 4h illustrate straightforward arrangements for simulating the pair of quantum Toffoli gates illustrated in FIGS. 4a-c and FIGS. 4d-f. The systems in FIGS. 4g and 4h can be reduced to the three CCNOT gates illustrated in FIG. 4i. FIG. 4i illustrates an arrangement for simulating a quantum Toffoli gate. Each system of FIGS. 4g and 4h relates to a corresponding CNOT configuration in FIG. 4i. The CNOT configuration encircled by the large dashed circle in FIG. 4i relates to the system of FIG. 4g and the configuration illustrated by the small dashed circles in FIG. 4i together also forms a CNOT configuration relating to the system of FIG. 4h. In other words, the arrangement for simulating a quantum Toffoli gate illustrated in FIG. 4i captures the symmetry of the quantum gate systems of FIGS. 4a-c and FIGS. 4d-f.

Figure 5:
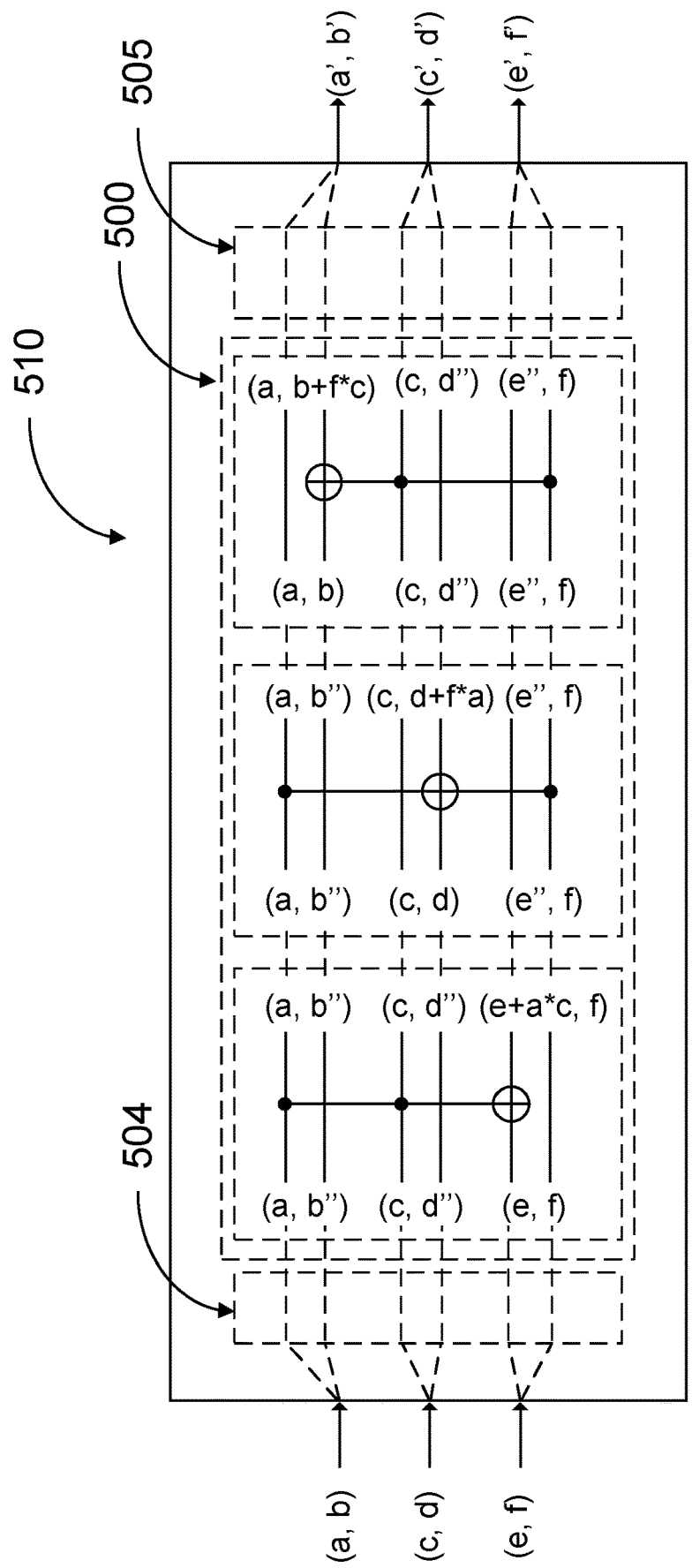
FIG. 5 illustrates a system for simulating a quantum gate system.

FIG. 5 illustrates a system 510 for simulating a quantum gate system. The system for simulating a quantum gate system comprises an arrangement 500 for simulating a quantum Toffoli gate, and at least one logical element 504, 505 communicatively connected to provide and/or receive at least one classical bit to and/or from the arrangement 500 for simulating a quantum Toffoli gate. The system 510 for simulating a quantum gate system enables implementation of gates based on the arrangement 500 for simulating a quantum Toffoli gate, e.g. a system for simulating a quantum Fredkin gate. The system 510 then has the phase kickback properties of the arrangement 500 for simulating a quantum Toffoli gate. Stated differently, the additional at least one logical element provides variations of the arrangement 500 for simulating a quantum Toffoli gate.

A system comprising an arrangement 500 for simulating a quantum Toffoli gate further enables systems for simulating the Deutsch-Jozsa algorithm, Shor's algorithm, quantum teleportation and quantum cryptology that uses computational resources scales polynomially with the problem size.

According to some aspects, the system is arranged to receive first to sixth classical system input bits and arranged to output first to sixth classical system output bits. The first classical system input bit is arranged to be mapped to the first classical output bit. The third classical system input bit with modulo-2 addition of modulo-2 multiplication of the first classical system input bit and modulo-2 addition of the third and the fifth classical system input bits is arranged to be mapped to the third classical system output bit. The fifth classical system input bit with modulo-2 addition of modulo-2 multiplication of the first classical system input bit and modulo-2 addition of the fifth and the third classical system input bits is arranged to be mapped to the fifth classical system output bit. Modulo-2 addition of the second classical system input bit with modulo-2 multiplication of first and second sums is arranged to be mapped to the second classical system output bit, the first sum comprising modulo-2 addition of the sixth and the fourth classical system input bits and the second sum comprising modulo-2 addition of the fifth and the third classical system input bits. The fourth classical system input bit with modulo-2 addition of modulo-2 multiplication of the first classical system input bit and modulo-2 addition of the fourth and the sixth classical system input bits is arranged to be mapped to the fourth classical system output bit. The sixth classical system input bit with modulo-2 addition of modulo-2 multiplication of the first classical system input bit and modulo-2 addition of the fourth and the sixth classical system input bits is arranged to be mapped to the sixth classical system output bit. Stated differently, the system is arranged to perform the mapping (a,b)(c,d)(e,f)→(a,b+(f+d)*(e+c))(c+a*(c+e),d+a*(d+f))(e+a*(e+c),f+a*(d+f)), i.e. this implements a simulation of a quantum Fredkin gate by acting on three pairs of bits, wherein * is again the logical AND.

According to some aspects, the at least one logical element comprises first and second controlled-NOT, CNOT, arrangements, wherein each CNOT arrangement is arranged to receive first to fourth CNOT input bits, and arranged to map its first CNOT input bit with modulo-2 addition of its third CNOT input bit to its first CNOT output bit, map its second CNOT input bit to its second CNOT output bit, map its third CNOT input bit to its third CNOT output bit, and map its fourth CNOT input bit with modulo-2 addition of its second CNOT input bit to its fourth CNOT output bit. The first CNOT arrangement is arranged to output its first to fourth CNOT output bits to respective third to sixth input bits of the first to sixth classical input bits of the arrangement for simulating a quantum Toffoli gate. The second CNOT arrangement is arranged to receive the third to sixth classical output bits of the arrangement for simulating a quantum Toffoli gate as its respective first to fourth CNOT input bits. This implements a system 510 for simulating a quantum Fredkin gate, based on an arrangement 500 for simulating a Toffoli gate flanked by two CNOT arrangements, as will be described further below in relation to FIGS. 6a-c.

According to some aspects, the arrangement for simulating a quantum Toffoli gate and/or the at least one logical element is arranged as at least two separate modules, wherein the modules are communicatively connected to each other. Splitting the system over a plurality of separate modules communicatively connected to each other enables a system that can be easily and quickly modified according to need or desire. For instance, faulty components can be easily replaced. The system can also be modified to implement simulations of different quantum gates or different quantum algorithms.

Figure 6A:
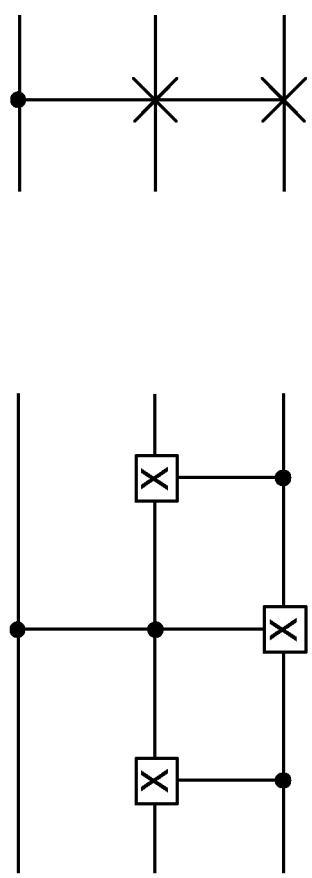
FIG. 6
a and b illustrate schematic representations of quantum Fredkin gates;
c illustrates a system for simulating a Fredkin gate.
Figure 6B:
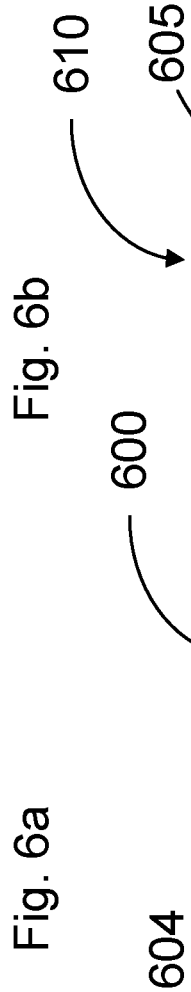
Figure 6C:
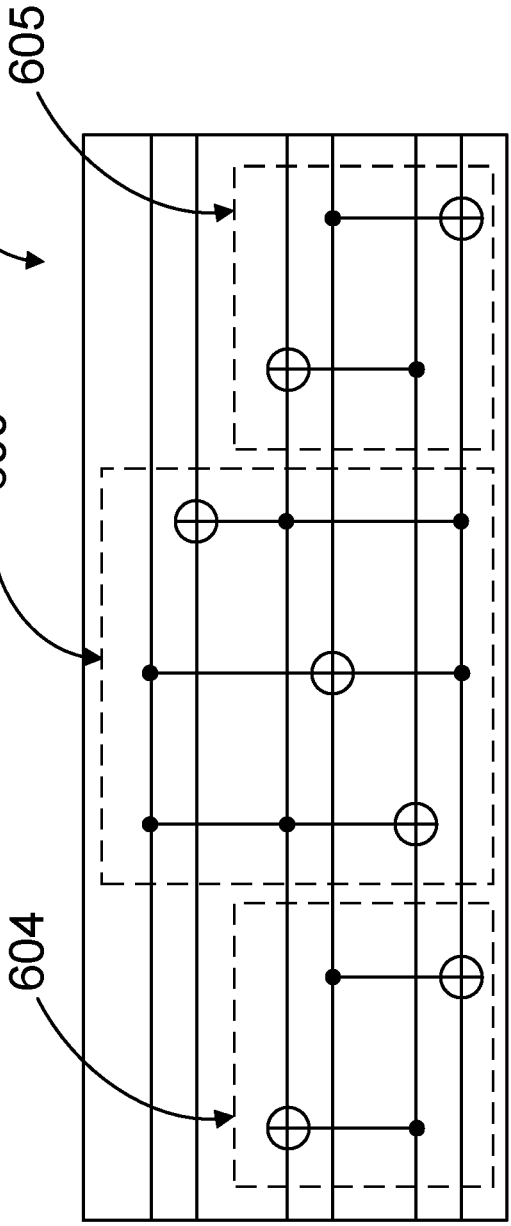

FIGS. 6a and 6b illustrate schematic representations of quantum Fredkin gates, and FIG. 6c illustrates a system for simulating a quantum Fredkin gate. The system for simulating a quantum Fredkin gate 610 comprises an arrangement for simulating a quantum Toffoli gate 600 and first and second controlled-NOT, CNOT, arrangements 604, 605. The arrangement 600 for simulating a quantum Toffoli gate corresponds to an arrangement as described in relation to FIG. 3a above, and the first and second CNOT arrangements 604, 605 correspond to CNOT arrangements as described in relation to FIG. 1j above. The CNOT arrangements 604, 605 are flanking the arrangement 600 for simulating a quantum Toffoli gate, and the CNOT arrangements are communicatively connected to the arrangement 600 for simulating a quantum Toffoli gate. Specifically, the first CNOT arrangement 604 is arranged to output its first to fourth CNOT output bits to respective third to sixth input bits of the first to sixth classical input bits of the arrangement 600 for simulating a quantum Toffoli gate. The second CNOT arrangement 605 is arranged to receive the third to sixth classical output bits of the arrangement 600 for simulating a quantum Toffoli gate as its respective first to fourth CNOT input bits. The system 610 for simulating a quantum Fredkin gate is thus arranged to perform the mapping (a,b)(c,d)(e,f) →(a,b+(f+d)*(e+c))(c+a*(c+e),d+a*(d+f))(e+a*(e+c),f+a* (d+f)).

FIGS. 7 and 8 illustrates variations of arrangements for simulating a Toffoli gate and systems for simulating a Fredkin gate, wherein at least one classical control bit is arranged to be flipped. Specifically, FIGS. 7a, c and e illustrate schematically a quantum Toffoli gate, wherein a first, a second and both first and second control bits are arranged to be flipped. FIGS. 7b, d and f illustrate systems for simulating a respective quantum Toffoli gate of FIGS. 7a, c and e.

Figure 8B:
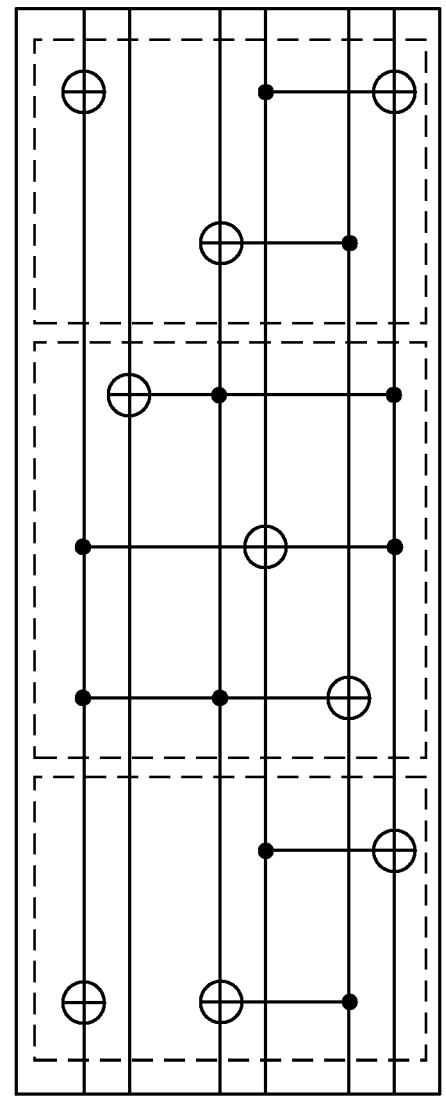
FIG. 8
a illustrates schematically a quantum Fredkin gate;
b illustrates a system for simulating a quantum Fredkin gate.
Figure 7E:
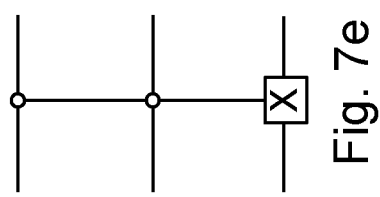
Figure 8A:
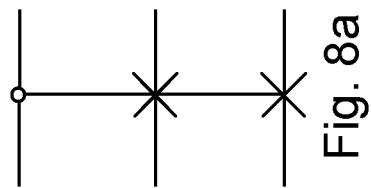

FIG. 8a illustrates schematically a quantum Fredkin gate and FIG. 8b illustrates a system for simulating the Fredkin gate of FIG. 8a.

The arrangements for simulating quantum Toffoli gates and the system for simulating a Fredkin gate correspond to previously described arrangements and systems, with the exception that one or two of the bits serving as CCNOT control bits are flanked by X-gates, as described in relation to FIG. 1b. The affected control bits are thus arranged to be flipped.

Figure 7B:
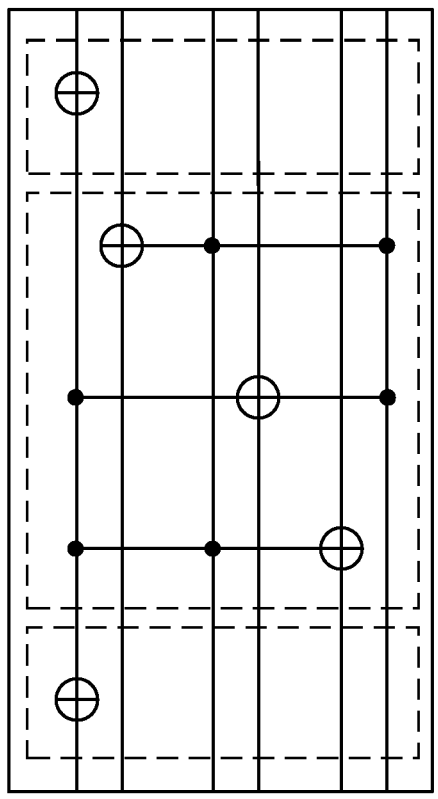
FIG. 7
a, c and e illustrate schematically a quantum Toffoli gate;
b, d and f illustrate systems for simulating a quantum Toffoli gate.
Figure 7D:
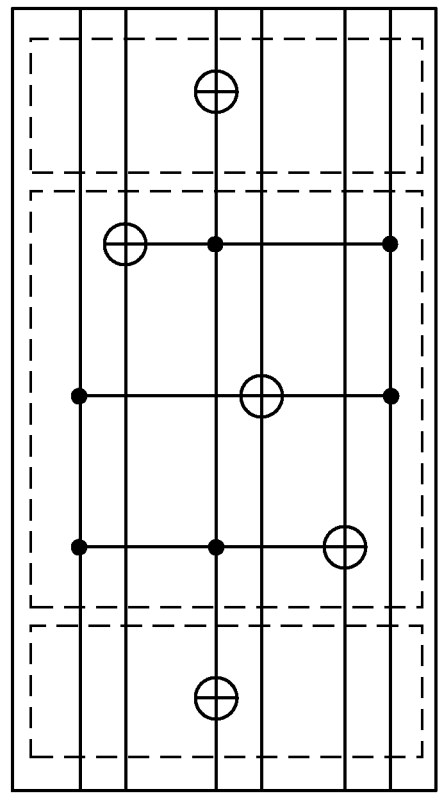
Figure 7A:
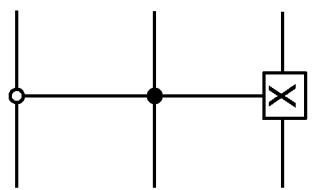
Figure 7C:
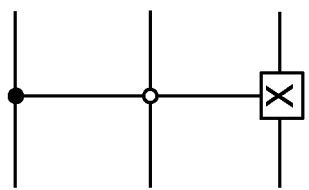
Figure 7F:
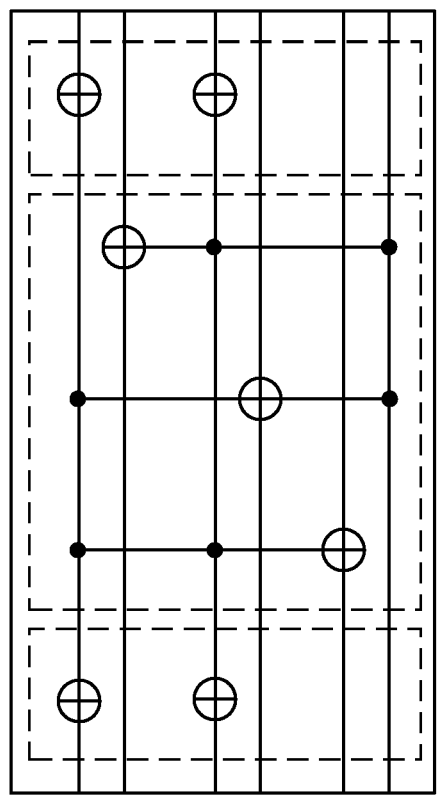

The resulting mappings are given by
$(a,b)(c,d)(e,f) \rightarrow (a,b+f^*c)(c,d+f^*(a+1))(e+(a+1)^*c,f)$ for the system illustrated in FIG. 7b,
$(a,b)(c,d)(e,f) \rightarrow (a,b+f^*(c+1))(c,d+f^*a)(e+a^*(c+1),f)$ for the system illustrated in FIG. 7d,
$(a,b)(c,d)(e,f) \rightarrow (a,b+f^*(c+1))(c,d+f^*(a+1))(e+(a+1)^*(c+1),f)$ for the system illustrated in FIG. 7f, and
$(a,b)(c,d)(e,f) \rightarrow (a,b+(f+d)^*(e+c))(c+(a+1)^*(c+e),d+(a+1)^*(d+f))(e+(a+1)^*(e+c),f+(a+1)^*(d+f))$ for the system illustrated in FIG. 8b.

In other words, FIGS. 7b, 7d, 7f and 8b illustrate alternative embodiments falling within the inventive concept. The mappings all comprise mappings from systems for simulating quantum Toffoli and Fredkin gates without any CCNOT control bit being arranged to be flipped.

Figure 9A:
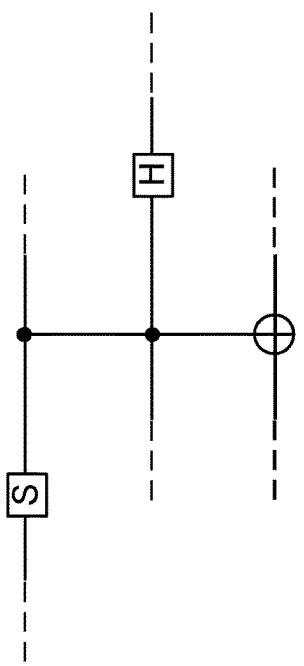
FIG. 9
a illustrates schematically a quantum gate system;
b and c illustrate systems for simulating a quantum gate system.
Figure 9B:
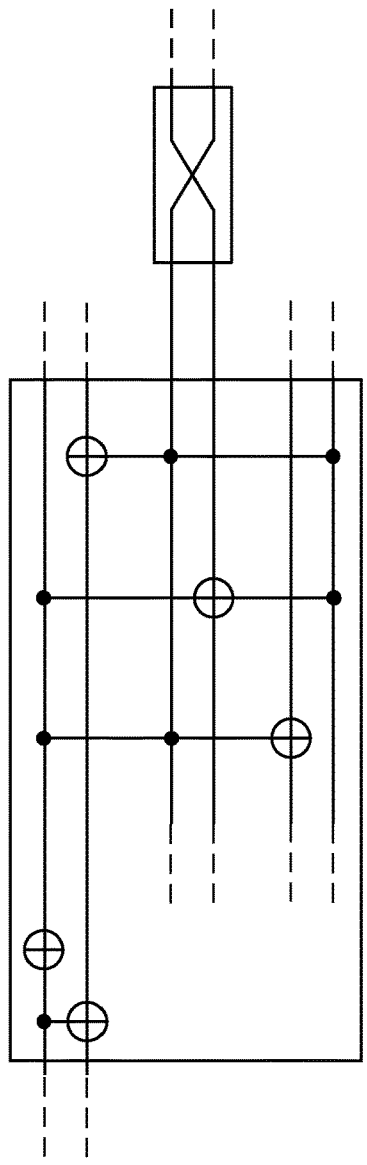
Figure 9C:
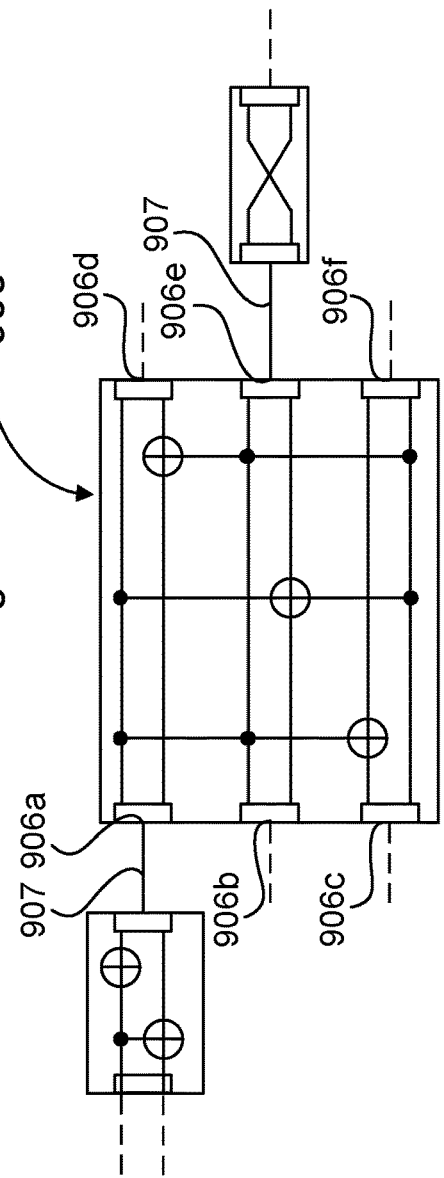

FIG. 9a illustrates schematically a quantum gate system and FIGS. 9b and 9c illustrate systems for simulating the quantum gate system. FIGS. 9b and 9c illustrates how systems for simulating a general quantum gate system can be implemented in a modular fashion. The principle is based on encapsulation of subsets of all the logic components comprised in the system. For instance, in FIG. 9b, a system for simulating the phase gate and the quantum Toffoli gate of FIG. 9a has been encapsulated, i.e. logically separated, in a separate module and the Hadamard gate of FIG. 9a has been implemented in a separate module for simulating a quantum Hadamard gate. A system for simulating a quantum gate system may thus comprise several subsystems for simulating one or more quantum gates.

FIG. 9c illustrates an encapsulated arrangement for simulating a Toffoli gate communicatively connected with respective encapsulated systems for simulating a phase gate and a Hadamard gate. The arrangement 900 is an arrangement according to FIG. 3a, further comprising first, second and third input ports 906a, 906b, 906c and first, second and third output ports 906d, 906e, 906f. The first input port 906a is arranged to receive the first and second classical input bits. The second input port 906b is arranged to receive the third and fourth classical input bits. The third input port 906c is arranged to receive the fifth and sixth classical input bits. The first output port 906d is arranged to output the first and second classical output bits. The second output port 906e is arranged to output the third and fourth classical output bits. The third output port 906f is arranged to output the fifth and sixth classical output bits. The phase gate and the Hadamard gate each comprise respective input and output ports arranged to receive and output a pair of classical bits. According to some aspects, the input and output ports of the respective systems comprises a USB port. According to some further aspects, the systems are communicatively connected by means of USB cables connecting an output port of one system with an input port of another system. The use of ports arranged to receive and output pairs of classical bits simplifies the construction and modification of systems for simulation of quantum gate systems. Subsystems can easily be removed, replaced or expanded as desired. This further facilitates the implementation of quantum algorithms, e.g. the Deutsch-Jozsa algorithm, Simon's algorithm, quantum teleportation and quantum cryptography.

FIG. 10 illustrates method steps of a method for simulating a quantum Toffoli gate. The method comprises receiving S10 at least first, second, third, fourth, fifth and sixth classical input bits (a, b, c, d, e, f). The method further comprises outputting S20 at least first, second, third, fourth, fifth and sixth classical output bits, wherein the first, third and fifth classical output bits are arranged to simulate controlled-controlled-NOT, CCNOT, logic based on the first, third and fifth classical input bits, and wherein the second, fourth and sixth classical output bits are arranged to simulate phase kickback based on the first, second, third, fourth and sixth classical input bits.

According to some aspects, outputting S20 the first, second, third, fourth, fifth and sixth classical output bits further comprises mapping S22 a first set of classical bits for the simulation of the CCNOT logic, wherein mapping the first set of classical bits comprises mapping the first input bit to the first classical output bit, mapping the third classical input bit to the third classical output bit, and mapping the fifth classical input bit with modulo-2 addition of modulo-2 multiplication of the first and third classical input bits to the fifth classical output bit. Outputting S20 the first, second, third, fourth, fifth and sixth classical output bits also comprises mapping S24 a second set of classical for the simulation of the phase kickback, wherein mapping the second set of classical bits comprises mapping the second classical input bit with modulo-2 addition of modulo-2 multiplication of the sixth and third classical input bits to the second classical output bit, mapping the fourth classical input bit with modulo-2 addition of modulo-2 multiplication of the sixth and first classical input bits to the fourth classical output bit, and mapping the sixth classical input bit to the sixth classical output bit. The method corresponds to the steps carried out by the arrangement for simulating a quantum Toffoli gate and the method therefore has all the advantages of the arrangement for simulating a quantum Toffoli gate. In particular, denoting the first to sixth classical input bits as a, b, c, d, e, f, the simulation of the Toffoli gate acts on three pairs of bits as $(a,b)(c,d)(e,f) \rightarrow (a,b+f^*c)(c,d+f^*a)(e+a^*c,f)$, wherein the addition is modulo 2, i.e. logical exclusive-OR, XOR, and wherein * is modulo-2 multiplication, i.e. logical AND.

The disclosure also relates to a computer program for simulating a quantum Toffoli gate. The computer program comprising instructions which, when the program is executed by a computer, cause the computer to carry out the method as described above and below.

The invention claimed is:

1. A system for simulating a quantum Toffoli gate, the system arranged to:
   receive at least first, second, third, fourth, fifth and sixth classical input bits (a, b, c, d, e, f) and;
   output at least first, second, third, fourth, fifth and sixth classical output bits, wherein:
      the first, third and fifth classical output bits are arranged to simulate controlled-controlled-NOT, controlled-controlled-NOT (CCNOT), logic based on the first, third and fifth classical input bits (a, c, e), and
      the second, fourth and sixth classical output bits are arranged to simulate phase kickback based on the first, second, third, fourth and sixth classical input bits (a, b, c, d, f).

2. The system according to claim 1, wherein the simulation of the CCNOT logic is achieved by mapping a first set of classical bits comprising the first classical input bit (a) being arranged to be mapped to the first classical output bit,
   the third classical input bit (c) being arranged to be mapped to the third classical output bit, and
   the fifth classical input bit (e) with modulo-2 addition of modulo-2 multiplication of the first (a) and third (c)

classical input bits being arranged to be mapped to the fifth classical output bit, and wherein the simulation of the phase kickback is achieved by a second set of classical bits comprising the second classical input (b) bit with modulo-2 addition of modulo-2 multiplication of the sixth (e) and third (c) classical input bits being arranged to be mapped to the second classical output bit, the fourth classical input bit (d) with modulo-2 addition of modulo-2 multiplication of the sixth (e) and first (a) classical input bits being arranged to be mapped to the fourth classical output bit, and the sixth classical input bit (e) being arranged to be mapped to the sixth classical output bit.

3. The system according to claim 1, wherein the system comprises first, second and third classical control-control-NOT, CCNOT, gates, wherein each classical CCNOT gate is arranged to receive respective first to sixth classical CCNOT input bits and to output respective first to sixth CCNOT output bits, and wherein:

the first classical CCNOT gate is arranged to map its fifth CCNOT classical input bit (e) with modulo-2 addition of modulo-2 multiplication of its first (a) and third (c) classical CCNOT input bits is to its fifth classical CCNOT output bit, and the second classical CCNOT gate is arranged to map its fourth classical CCNOT input bit (d) with modulo-2 addition of modulo-2 multiplication of its sixth (f) and first classical (a) CCNOT input bits to its fourth classical CCNOT output bit, and wherein the third classical CCNOT gate is arranged to map its second classical CCNOT input bit (b) with modulo-2 addition of modulo-2 multiplication of its sixth (f) and third (c) classical CCNOT input bits to its second classical CCNOT output bit.

4. The system according to claim 3, wherein:

the first classical CCNOT gate is arranged to receive the first to sixth classical input bits (a, b, c, d, e, f) received by the system for simulating a quantum Toffoli gate, wherein the first classical CCNOT gate is communicatively connected to the second classical CCNOT gate such that the first to sixth classical CCNOT output bits output by the first CCNOT gate is arranged to be received as respective first to sixth classical CCNOT input bits at the second classical CCNOT gate, wherein the second classical CCNOT gate is communicatively connected to the third classical CCNOT gate such that the first to sixth classical CCNOT output bits output by the second CCNOT gate is arranged to be received as respective first to sixth classical CCNOT input bits at the third classical CCNOT gate, and wherein the third classical CCNOT gate being arranged to output the first to sixth classical output bits of the system for simulating a quantum Toffoli gate.

5. The system according to claim 1, further comprising:
first, second and third input ports; and
first, second and third output ports,
wherein the first input port is arranged to receive the first and second classical input bits (a, b), wherein the second input port is arranged to receive the third and fourth classical input bits (c, d), and wherein the third input port is arranged to receive the fifth and sixth classical input bits (e, f), and
wherein the first output port is arranged to output the first and second classical output bits, wherein the second output port is arranged to output the third and fourth classical output bits, and wherein the third output port is arranged to output the fifth and sixth classical output bits.

6. A system for simulating a quantum gate system, the system comprising:
the simulation system for simulating a quantum Toffoli gate according to claim 1, and
at least one logical element communicatively connected to provide and/or receive at least one classical bit to and/or from the simulation system for simulating a quantum Toffoli gate.

7. The system according to claim 6, wherein the system is arranged to receive first to sixth classical system input bits (a, b, c, d, e, f) and arranged to output first to sixth classical system output bits (a', b', c', d', e', f), and wherein:

the first classical system input bit (a) is arranged to be mapped to the first classical system output bit, the third classical system input bit (c) with modulo-2 addition of modulo-2 multiplication of the first classical system input bit (a) and modulo-2 addition of the third (c) and the fifth (e) classical system input bits is arranged to be mapped to the third classical system output bit, the fifth classical system input bit (e) with modulo-2 addition of modulo-2 multiplication of the first classical system input bit (a) and modulo-2 addition of the fifth (e) and the third (c) classical system input bits is arranged to be mapped to the fifth classical system output bit, wherein modulo-2 addition of the second classical system input bit (b) with modulo-2 multiplication of first and second sums is arranged to be mapped to the second classical system output bit, the first sum comprising modulo-2 addition of the sixth (f) and the fourth (d) classical system input bits and the second sum comprising modulo-2 addition of the fifth (e) and the third (c) classical system input bits, the fourth classical system input bit (d) with modulo-2 addition of modulo-2 multiplication of the first classical system input bit (a) and modulo-2 addition of the fourth (d) and the sixth (f) classical system input bits is arranged to be mapped to the fourth classical system output bit, and the sixth classical system input bit (f) with modulo-2 addition of modulo-2 multiplication of the first classical system input bit (a) and modulo-2 addition of the fourth (d) and the sixth classical system input bits (f) is arranged to be mapped to the sixth classical system output bit.

8. The system according to claim 6, wherein the at least one logical element comprises first and second controlled-NOT, CNOT, arrangements, wherein each CNOT arrangement is arranged to receive first to fourth CNOT input bits, and arranged to map its first CNOT input bit with modulo-2 addition of its third CNOT input bit to its first CNOT output bit, map its second CNOT input bit to its second CNOT output bit, map its third CNOT input bit to its third CNOT output bit, and map its fourth CNOT input bit with modulo-2 addition of its second CNOT input bit to its fourth CNOT output bit, wherein the first CNOT arrangement is arranged to output its first to fourth CNOT output bits to respective third to sixth input bits of the first to sixth classical input bits of the arrangement for simulating a quantum Toffoli gate, and wherein the second CNOT arrangement is arranged to receive the third to sixth classical output bits of the arrangement for simulating a quantum Toffoli gate as its respective first to fourth CNOT input bits.

9. The system according to claim 6, wherein the arrangement for simulating a quantum Toffoli gate and/or the at least one logical element is arranged as at least two separate modules, wherein the modules are communicatively connected to each other.

10. A method for simulating a quantum Toffoli gate, the method comprising:
receiving at least first, second, third, fourth, fifth and sixth classical input bits (a, b, c, d, e, f),
outputting at least first, second, third, fourth, fifth and sixth classical output bits, wherein the first, third and fifth classical output bits are arranged to simulate controlled-controlled-NOT, CCNOT, logic based on the first, third and fifth classical input bits, and wherein the second, fourth and sixth classical output bits are arranged to simulate phase kickback based on the first, second, third, fourth and sixth classical input bits.

11. The method according to claim 10, wherein the step of outputting at least the first, second, third, fourth, fifth and sixth classical output bits further comprises:
mapping a first set of classical bits for the simulation of the CCNOT logic, wherein mapping the first set of classical bits comprises mapping the first input bit to the first classical output bit, mapping the third classical input bit to the third classical output bit, and mapping the fifth classical input bit with modulo-2 addition of modulo-2 multiplication of the first and third classical input bits to the fifth classical output bit, and
mapping a second set of classical for the simulation of the phase kickback, wherein mapping the second set of classical bits comprises mapping the second classical input bit with modulo-2 addition of modulo-2 multiplication of the sixth and third classical input bits to the second classical output bit, mapping the fourth classical input bit with modulo-2 addition of modulo-2 multiplication of the sixth and first classical input bits to the fourth classical output bit, and mapping the sixth classical input bit to the sixth classical output bit.

12. A non-transitory computer storage medium for simulating a quantum Toffoli gate storing computer-executable instructions that, when executed by a computer, cause the computer to perform the method according to claim 10.

* * * * *